(12) United States Patent
Cai

(10) Patent No.: US 10,566,394 B2
(45) Date of Patent: Feb. 18, 2020

(54) ORGANIC LIGHT-EMITTING DISPLAY PANEL, DEVICE AND METHOD FOR MANUFACTURING THE SAME

(71) Applicant: SHANGHAI TIANMA MICRO-ELECTRONICS CO., LTD., Shanghai (CN)

(72) Inventor: Xiaobo Cai, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 15/804,905

(22) Filed: Nov. 6, 2017

(65) Prior Publication Data

US 2018/0061910 A1    Mar. 1, 2018

(30) Foreign Application Priority Data

Mar. 28, 2017   (CN) .......................... 2017 1 0191455

(51) Int. Cl.
*H01L 27/32* (2006.01)
*H01L 51/52* (2006.01)
*H01L 51/56* (2006.01)

(52) U.S. Cl.
CPC ...... *H01L 27/3223* (2013.01); *H01L 27/3246* (2013.01); *H01L 27/3248* (2013.01); *H01L 27/3258* (2013.01); *H01L 27/3276* (2013.01); *H01L 51/5253* (2013.01); *H01L 51/56* (2013.01); *H01L 2227/323* (2013.01)

(58) Field of Classification Search
CPC ... H01L 27/32; H01L 27/322; H01L 27/3223; H01L 51/52; H01L 51/525; H01L 51/5253; H01L 51/56
See application file for complete search history.

(56) References Cited

U.S. PATENT DOCUMENTS

| 2016/0066409 | A1* | 3/2016 | Kwon | H05K 1/028 174/254 |
| 2016/0260928 | A1* | 9/2016 | Choi | H01L 51/5253 |
| 2017/0278912 | A1* | 9/2017 | Kim | H01L 27/3246 |

FOREIGN PATENT DOCUMENTS

| CN | 104701342 A | 6/2015 |
| CN | 105247701 A | 1/2016 |

* cited by examiner

*Primary Examiner* — Fazli Erdem
(74) *Attorney, Agent, or Firm* — Alston & Bird LLP

(57) ABSTRACT

Disclosed is an organic light-emitting display panel, which comprises a substrate, the substrate comprises a display region and a non-display region, wherein, the non-display region comprises: an insulating layer, which is provided on the same side as the array layer and provided with at least one groove by which the substrate is exposed; a metal layer, which comprises a first part and a second part, the first part covers the groove and contacts the substrate at the bottom of the groove, and the second part covers an outside of the groove and contacts the insulating layer; and at least one bank, contacting the second part, and wherein the bank comprises an organic material.

20 Claims, 24 Drawing Sheets

ORGANIC LIGHT-EMITTING DISPLAY PANEL, DEVICE AND METHOD FOR MANUFACTURING THE SAME

CROSS-REFERENCE TO RELATED APPLICATIONS

This application claims priority to Chinese Patent Application No. CN201710191455.X, filed on Mar. 28, 2017 and entitled "ORGANIC LIGHT-EMITTING DISPLAY PANEL, ORGANIC LIGHT-EMITTING DISPLAY DEVICE AND METHOD FOR MANUFACTURING ORGANIC LIGHT-EMITTING DISPLAY PANEL", the disclosure of which is incorporated herein by reference in its entirety.

TECHNICAL FIELD

Embodiments of the present disclosure relate to the field of organic light-emitting display, and in particular, to an organic light-emitting display panel, an organic light-emitting display device and a method for manufacturing an organic light-emitting display panel.

BACKGROUND

An organic light-emitting display device is a self-emission display device including an organic light-emitting device (OLED). The organic light-emitting display device includes an organic light-emitting device, which includes a first electrode, a second electrode and an organic light-emitting layer formed between the first electrode and the second electrode. In the organic light-emitting device, the holes (or electrons) injected from the first electrode and the electrons (or holes) injected from the second electrode are combined to generate excitons, and the excitons relaxed from an excited state to a ground state, hence emit light.

As a self-emission display device, the organic light-emitting display device does not require an independent light source. Therefore, the organic light-emitting display device can operate at a low voltage, so that it may be light and thin, and it may have high-quality characteristics such as a wide visual angle, a high contrast and a fast response. Therefore, the organic light-emitting display device as the next-generation display device gets much attention.

However, at the end of manufacturing of an organic light-emitting device, a film is deposited in the display region using a mask plate to form a film encapsulation structure to block aqueous vapor from eroding the organic light-emitting layer. In order to guarantee that the mask plate does not damage the display device and the peripheral cables, a bank is employed to support the edge of the mask plate. As shown in FIG. 1, it is a conventional structural representation of a non-display region of an organic light-emitting display panel. The non-display region NA includes a substrate 1, an inorganic layer 2 and a bank 3, wherein, during evaporation of a film, the bank holds the mask plate 4. Cracks is easily formed in the inorganic layer in the edge region S during the cutting or bending of a display device, and cracks may be caused in the inorganic layer 2 in the region S when the mask plate 4 presses on the bank 3. These cracks tend to extend into the display region along the inorganic layer 2, so that the organic light-emitting device may be affected, and the probability that aqueous vapor invade into the side of the organic light-emitting device may be increased. As a result, the structure of the non-display region needs to be optimized.

SUMMARY

In view of this, the present disclosure provides an organic light-emitting display panel, an organic light-emitting display device including the organic light-emitting display panel and a method for manufacturing an organic light-emitting display panel.

In a first aspect, embodiments of the application provide an organic light-emitting display panel, which comprising: a substrate, which includes a display region and a non-display region; wherein, the display region includes: an array layer, which is provided on the substrate; an organic light-emitting device, which is provided on one side of the array layer facing away from the substrate, and the organic light-emitting device layer successively includes a planarization layer, a first electrode, a light-emitting layer and a second electrode, and a pixel defining layer provided between the first electrode and the second electrode to partition the light-emitting layer into light-emitting pixels; and an encapsulation film, which is provided on one side of the organic light-emitting device facing away from the substrate, wherein, the non-display region includes: an insulating layer, which is provided on the same side as the array layer and provided with at least one groove by which the substrate is exposed; a metal layer, which includes a first part and a second part, wherein the first part is a part for covering the groove and contacting the substrate, and the second part is a part for covering an outside of the groove and contacting the insulating layer; and at least one bank, which is provided on one side of the second part facing away from the substrate and contacts the second part, and the bank includes an organic material.

In a second aspect, embodiments of the disclosure further provide an organic light-emitting display device, which comprises the organic light-emitting display panel according to the first aspect.

In a third aspect, embodiments of the disclosure further provide a method for manufacturing an organic light-emitting display panel, which includes: providing a substrate, which includes a display region and a non-display region; manufacturing an array layer on the substrate; manufacturing an organic light-emitting device on one side of the array layer facing away from the substrate, wherein the preparation of the organic light-emitting device includes successively manufacturing a planarization layer, a first electrode, a pixel defining layer, a light-emitting layer and a second electrode; manufacturing an encapsulation film on one side of the organic light-emitting device facing away from the substrate; wherein, the method further includes, in the non-display region of the substrate: manufacturing an insulating layer, which is provided on the same side as the array layer and etched to form at least one groove by which the substrate is exposed; manufacturing a metal layer, which includes a first part and a second part, wherein the first part is a part for covering the groove and contacting the substrate, and the second part is a part for covering an outside of the groove and contacting the insulating layer; and manufacturing at least one bank on one side of the second part facing away from the substrate, wherein the bank contacts the second part, and the bank includes an organic material.

In comparison with the prior art, in the disclosure, the insulating layer in the non-display region of the substrate is provided with at least one groove, and the substrate is exposed by the groove, the first part of the metal layer covers the groove and contacts the substrate, a bank is provided on one side of the second part of the metal layer that faces away from the substrate, and this structure may improve the aqueous vapor blocking effect of the side and prevent cracks of an edge insulating layer from extending to the display region. Because the contact performance of an organic material layer filled with a metal is superior to the contact performance thereof with an inorganic material layer, the combining capacity between the bank and the substrate can be improved by placing a bank on the metal layer and connecting the bank with the substrate via the metal layer, thereby reducing the peel-off risk during contacting and pressing a mask plate.

Cracks tend to be formed in an edge of inorganic layer during cutting or bending of a display device, and cracks may be caused in the insulating layer when the mask plate presses the bank. These cracks tend to extend into the display region along an intact insulating layer. In the embodiments, a groove is formed, and a metal layer is provided on the groove. This may prevent the expansion of the cracks, and hence the side encapsulation effect can be improved, and less aqueous vapor can enter from the lateral side and erode the organic light-emitting device.

DETAILED DESCRIPTION

Figure 1:
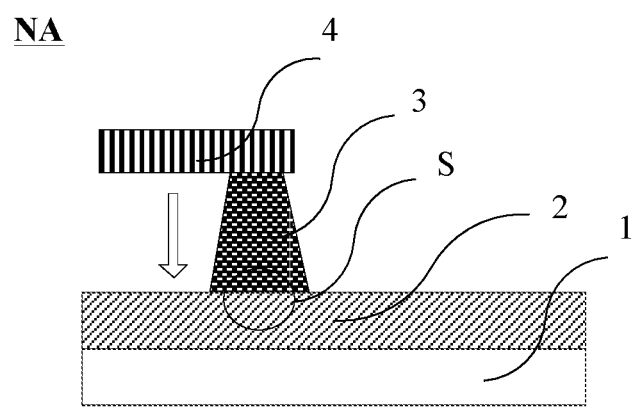
FIG. 1 is a conventional structural representation of the non-display region of an organic light-emitting display panel.

In order to achieve the above objects, characteristics and advantages of the disclosure more apparent, the disclosure will be further illustrated below in conjunction with the drawings and embodiments. However, the embodiments exemplified can be implemented in various forms, without being construed as limited to the embodiments illustrated herein; on the contrary, these embodiments are provided to make the disclosure more complete and intact and fully convey the concept of the exemplary embodiments to one skilled in the art. In the drawings, the same label represents the same or similar structure, thus it will not be described repeatedly. Words representing a location or a direction described in the disclosure are all illustrated in examples shown in the drawings, and variations may also be made as required, which pertains to the protection scope of the disclosure. The drawings in the disclosure are merely used for illustrating relative location relations, and the layer thickness of certain parts is exaggerated for easy understanding, which does not represent a scaling relation of the actual layer thickness.

It needs to be noted that, specific details are illustrated in the description below for fully understanding the disclosure. However, the disclosure can be implemented in other ways different from those described herein, and it may be similarly generalized by one skilled in the art without departing from the concept of the disclosure. Therefore, the disclosure will not be limited to the specific embodiments disclosed below. If certain vocabularies are employed in the disclosure and the claims to refer to certain components, it should be understood by one skilled in the art that, hardware manufactures may employ different nouns to name the same component. In the disclosure and the claims, components are not distinguished by different names but by different functions. For example, "include" mentioned throughout the disclosure and the claims is an open-type phraseology, so it will be construed as "include, but not limited to". It should be understood that, if it is said that one component is located on "one side" of another component throughout the disclosure and the claims, it will include that said component is or is not adjacent to said another component. If it is said that one component is "on" another component throughout the disclosure and the claims, it will include that said component is or is not adjacent to said another component. The subsequent description of the disclosure shows preferred embodiments for implementing the disclosure, but the description is given to illustrate the general principles of the disclosure, rather than to limit the scope of the disclosure. Therefore, the protection scope of the disclosure should be defined by the claims.

It needs to be noted that, specific details are illustrated in the description below for fully understanding the disclosure. However, the disclosure can be implemented in other ways different from those described herein, and it may be similarly generalized by one skilled in the art without departing from the concept of the disclosure. Therefore, the disclosure will not be limited to the specific embodiments disclosed below.

Figure 2:
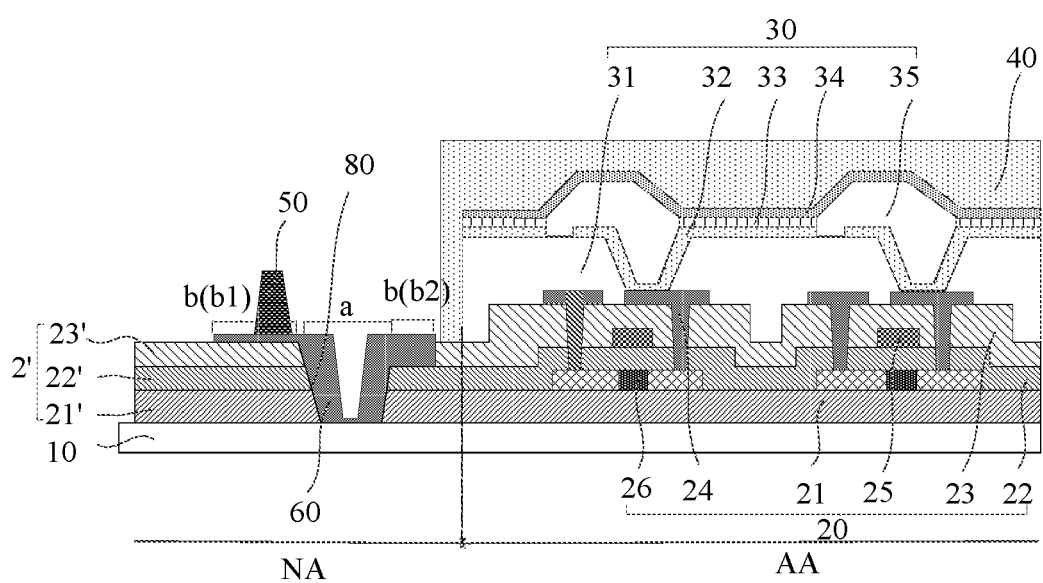
FIG. 2 is a structural representation of an organic light-emitting display panel according to an embodiment of the disclosure.

Referring to FIG. 2, it is a structural representation of an organic light-emitting display panel according to an embodiment of the disclosure. The organic light-emitting display panel according to the embodiment of the disclosure includes a substrate 10, the substrate 10 includes a display region AA and a non-display region NA, wherein, the display region AA includes: an array layer 20, which is provided on the substrate 10; an organic light-emitting device 30, which is provided on one side of the array layer 20 facing away from the substrate 10 and successively includes a planarization layer 31, a first electrode 32, a light-emitting layer 33 and a second electrode 34, and a pixel defining layer 35 provided between the first electrode 32 and the second electrode 34 to partition the light-emitting layer 33 into light-emitting pixels; and an encapsulation film 40, which is provided on one side of the organic light-emitting device 30 facing away from the substrate 10. The non-display region of the substrate 10 includes: an insulating layer 2', which is provided on the same side as the array layer 20 and provided with at least one groove, and the substrate 10 is exposed from the groove; a metal layer 60, which includes a first part a and a second part b (wherein, the second part b includes b1 and b2), the first part a is a part covering the groove and contacting the substrate 10, and the second part b is a part covering the outside of the groove and contacting the insulating layer 2'; at least one bank, which is provided on one side of the second part b that faces away from the substrate 10 and contacts the second part b, wherein, the material of the bank includes an organic material.

It needs to be noted that, FIG. 2 only shows a part of a light-emitting pixel as an example. The arrangement and the number of the light-emitting pixels may be set by one skilled in the art as required, without being defined in the disclosure.

It needs to be noted that, the insulating layer 2' is provided with at least one groove. For easy illustration, illustration is given in FIG. 2 by an example with which the non-display region of the substrate includes one groove.

It needs to be noted that, at least one bank is provided on one side of the second part b that faces away from the substrate 10. For easy illustration, illustration is given in FIG. 2 by an example in which one bank is included.

It needs to be noted that, the second part b in FIG. 2 includes b1 and b2. In the embodiment of the disclosure, illustration is given by an example in which a bank 50 is provided in the second part b1, optionally, the bank 50 may also be provided on b2, which is not exemplified in the disclosure.

In the embodiment of the disclosure, at least one groove 80 is provided in the insulating layer 2' in the non-display region NA of the substrate 10, and the substrate 10 is exposed from the groove 80, the first part of the metal layer 60 covers the groove 80 and contacts the substrate 10. This may effectively prevent cracks from extending along an intact inorganic layer and therefore effectively improves the interface contact performance between the metal layer 60 in the non-display region NA and the substrate 10 and prevent the inter-layer interface between the metal layer and the substrate from being peeled off during bending; moreover, cracks tend to be formed in the edge insulating layer during the cutting or bending of the organic light-emitting display panel, and cracks may be caused in the insulating layer when the mask plate presses the bank. These cracks tend to extend into the display region along an intact insulating layer. A groove is formed, and a metal layer is provided on the groove. This may prevent the expansion of the cracks, and hence the side encapsulation effect can be improved, and less aqueous vapor can enter from the lateral side and erode the organic light-emitting device.

A bank 50 is provided on one side of the second part b of the metal layer that faces away from the substrate, because the contact performance of an organic material with a metal is superior to the contact performance thereof with an inorganic material, the combining capacity between the bank and the substrate can be improved by placing the bank 50 on the metal layer 60 and connecting the bank 50 with the substrate 10 via the metal layer 60, and it reduce the risk of peeling-off during contacting and pressing a mask plate. In the embodiment of the disclosure, the aqueous vapor blocking effect of the side may be reinforced, and cracks of an edge insulating layer may be prevented from extending towards the display region.

In the embodiment of the disclosure, optionally, the substrate 10 may be a flexible substrate, and the material of the flexible substrate is not limited in the disclosure, and optionally, it may be an organic polymer, for example, the organic polymer may be one of polyimide (PI), polyamide (PA), polycarbonate (PC), polyethersulfone (PES), polyethylene terephthalate (PET), polyethylene naphthalate (PEN), polymethyl methacrylate (PMMA) and cycloolefin copolymer (COC). Because the contact performance of an organic material with a metal is superior to the contact performance of an inorganic material with a metal, in the embodiment of the disclosure, the interface combining performance between the metal layer and the substrate may be effectively improved by employing an organic polymer as the substrate, and the risk of peeling off between the metal layer and the substrate during bending may be may effectively alleviated.

The organic light-emitting device 30 successively includes a planarization layer 31, a first electrode 32, a light-emitting layer 33 and a second electrode 34, and a pixel defining layer 35 provided between the first electrode 32 and the second electrode 34 to partition the light-emitting layer 33 into light-emitting pixels. In the organic light-emitting device 30, the first electrode generates holes (or electrons), and the second electrode generates electrons (or holes), and the holes and electrons generated are injected into the light-emitting layer 33. The electrons and holes injected are combined with each other to form excitons, and the organic light-emitting device emits light by the energy generated when the excitons fall from an excited state to a ground state. The organic light-emitting device 30 may further include one or more of a hole injection layer, a hole transport layer, an electron blocking layer, a hole blocking layer, an electron transport layer and an electron injection layer. The light-emitting layer 33 may be a red light-emitting layer, a green light-emitting layer or a blue light-emitting layer. The light-emitting layer 33 may be a single white light-emitting layer. The light-emitting layer 33 may have a stacked structure of a red light-emitting layer, a green light-emitting layer and/or a blue light-emitting layer. When the light-emitting layer 33 has a stacked structure, a color filter may be included (not shown). The hole injecting layer and the hole transport layer may be provided between an anode layer 61 and a light-emitting layer 62. The electron injecting layer and/or the electron transport layer may be provided between a cathode layer 63 and a light-emitting layer 62. In the embodiment of the disclosure, one of the first electrode and the second electrode may be an anode, and the other may be a cathode, which is not defined in the disclosure and may be set by one skilled in the art as required. The hole injection layer, the hole transport layer, the electron transport layer and the electron injection layer may be formed in the whole display region AA of the substrate 10. The material of the first electrode may be a metal, an alloy, a metal nitride and a conductive metal oxide, etc. In the embodiment of the disclosure, the metal layer 60 may further include a part made on the same process as the first electrode. Since the metal layer 60 may further include a part made on the same process as the first electrode, the process can be saved. Other structures and materials of the device layer 30 may employ those of the prior art, which will not be described again here.

In the embodiment of the disclosure, optionally, the array layer 20 on the substrate 10 may have a top gate structure and successively include a first insulating layer 21, an active layer 26, a second insulating layer 22, a first metal layer 25, a third insulating layer 23 and a second metal layer 24, wherein the second metal layer 24 is connected with the active layer 26 by a via hole, the insulating layer 2' includes a part made on the same process as at least one of the first insulating layer 21, the second insulating layer 22 and the third insulating layer 23, and the metal layer 60 includes a part made on the same process as at least one of the first metal layer 25 and the second metal layer 24. Optionally, in FIG. 2, the insulating layer 2' includes a part 21' made on the same process as the first insulating layer 21, a part 22' made on the same process as the second insulating layer 22 and a part 23' made on the same process as the third insulating layer 23. The metal layer 60 includes a part 24' made on the same process as the second metal layer 24. The materials of the first insulating layer, the second insulating layer and the third insulating layer include an inorganic material, optionally, a silicon oxide or a silicon nitride, etc.

Figure 3:
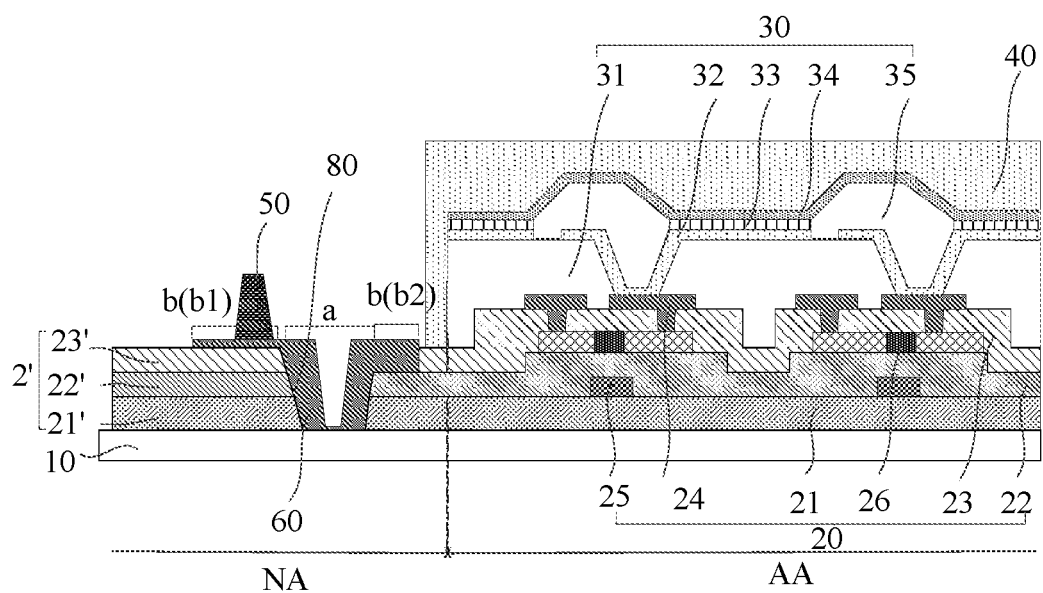
FIG. 3 is a structural representation of another organic light-emitting display panel according to an embodiment of the disclosure.

Optionally, referring to FIG. 3, the array layer 20 on the substrate 10 may have a bottom gate structure and successively include a first insulating layer 21, a first metal layer 25, a second insulating layer 22, an active layer 26, a third insulating layer 23 and a second metal layer 24, wherein the second metal layer 24 is connected with the active layer 26 by a via hole, the insulating layer 2' includes a part made on the same process as at least one of the first insulating layer 21, the second insulating layer 22 and the third insulating layer 23, and the metal layer 60 includes a part made on the same process as at least one of the first metal layer 25 and the second metal layer 24. Optionally, in FIG. 3, the insulating layer 2' includes a part 21' made on the same process as the first insulating layer 21, a part 22' made on the same process as the second insulating layer 22 and a part 23' made on the same process as the third insulating layer 23. The metal layer 60 includes a part 24' made on the same process as the second metal layer 24. The materials of the first insulating layer, the second insulating layer and the third insulating layer include an inorganic material, optionally, a silicon oxide or a silicon nitride, etc.

In the embodiment of the disclosure, the insulating layer 2' includes a part made on the same process as at least one of the first insulating layer 21, the second insulating layer 22 and the third insulating layer 23, and the metal layer 60 includes a part made on the same process as at least one of the first metal layer 25 and the second metal layer 24. By fully utilizing the manufacturing process of the display region to make the insulating layer in the non-display region, the manufacturing processes may be reduced, and the process efficiency may be improved. Moreover, the materials of the first insulating layer, the second insulating layer and the third insulating layer include an inorganic material, optionally, a silicon oxide or a silicon nitride. The above inorganic material has a compact film layer structure, and the insulating layer as the non-display region may effectively improve the water-oxygen blocking performance of the non-display region.

It needs to be noted that, in FIG. 2 and FIG. 3, the insulating layer in the non-display region is connected with the third insulating layer in the array layer in the display region, and in other embodiments, the insulating layer in the non-display region may also be isolated from the insulating layer in the display region, which is not defined in the disclosure.

It needs to be noted that, in FIG. 2 and FIG. 3, the metal layer 60 in the non-display region is connected with the second metal layer 24 in the array layer 20, and in other embodiments, the metal layer 60 in the non-display region may also be isolated from the metal layer in the display region, which is not defined in the disclosure.

Figure 4:
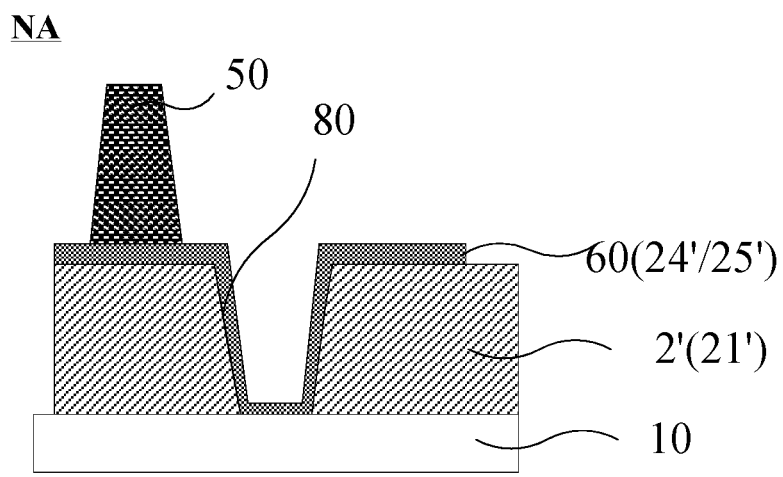
FIG. 4 is a structural representation of the non-display region of an organic light-emitting display panel according to an embodiment of the disclosure.

Optionally, referring to FIG. 4, it is a structural representation of the non-display region of an organic light-emitting display panel according to an embodiment of the disclosure. In the embodiment of the disclosure, the insulating layer 2' includes a part 21' made on the same process as the first insulating layer, and the metal layer 60 includes a part 25' made on the same process as the first metal layer 25 or a part 24' made on the same process as the second metal layer 24. The insulating layer 2' includes a part made on the same process as the first insulating layer 21', and insulating layer 2' only has one inorganic layer, and hence the number of inter-layer interfaces is small, and the peeling-off risk on the inter-layer interface during bending may be effectively reduced. It needs to be noted that, in this embodiment, the structure of non-display region may be applicable to both a top gate structure and a bottom gate structure, and the structure of the array layer is not limited in the disclosure.

Figure 5:
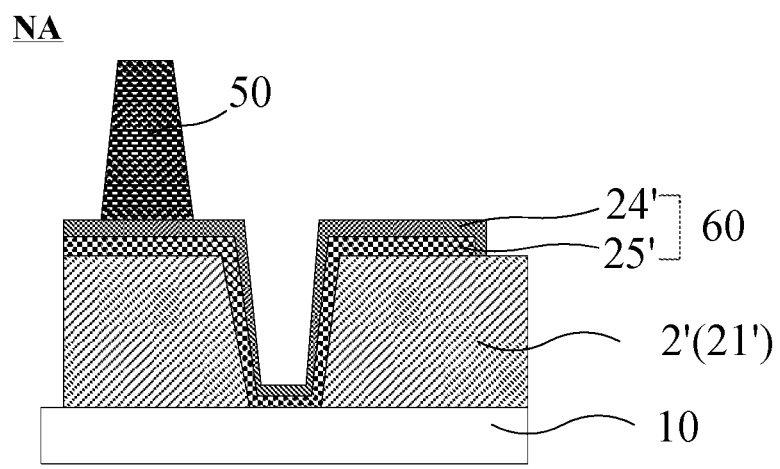
FIG. 5 is a structural representation of the non-display region of another organic light-emitting display panel according to an embodiment of the disclosure.

Optionally, referring to FIG. 5, it is a structural representation of the non-display region of another organic light-emitting display panel according to an embodiment of the disclosure. The difference from FIG. 4 lies in that, the metal layer 60 in FIG. 5 includes a part 25' made on the same process as the first metal layer 25 and a part 24' made on the same process as the second metal layer 24. The materials of the first metal layer 25 and the second metal layer 24 may include a titanium-aluminum-titanium stacked structure, wherein aluminum can react with water and oxygen to generate a compact oxide film, and the metal layer has a good toughness, so that the stress will not be easily concentrated during bending, and a good water-oxygen blocking performance and a good bending performance may be guaranteed at the same time by providing two metal layers. It needs to be noted that, in this embodiment, the structure of the non-display region may be applicable to both a top gate structure and a bottom gate structure, and the structure of the array layer is not limited in the disclosure.

Figure 6:
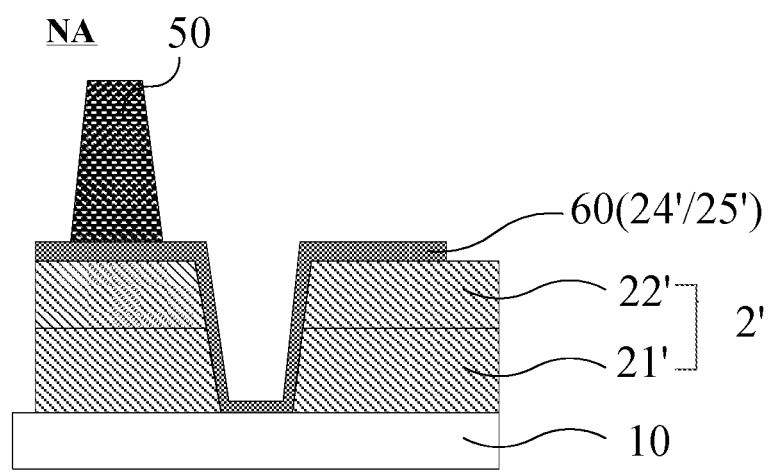
FIG. 6 is a structural representation of the non-display region of yet another organic light-emitting display panel according to an embodiment of the disclosure.

Optionally, referring to FIG. 6, it is a structural representation of the non-display region of yet another organic light-emitting display panel according to an embodiment of the disclosure. The insulating layer 2' includes a part 21' made on the same process as the first insulating layer 21 and a part 22' made on the same process as the second insulating layer 22, and the metal layer 60 includes a part 24' made on the same process as the second metal layer 24. This structure may be applicable to both a top gate structure and a bottom gate structure, which is not defined in the disclosure. When the structure of the array layer is a top gate structure, the metal layer may further include a part 25' made on the same process as the first metal layer 25, or it may include a part 25' made on the same process as the first metal layer 25 and a part 24' made on the same process as the second metal layer 24.

Figure 7:
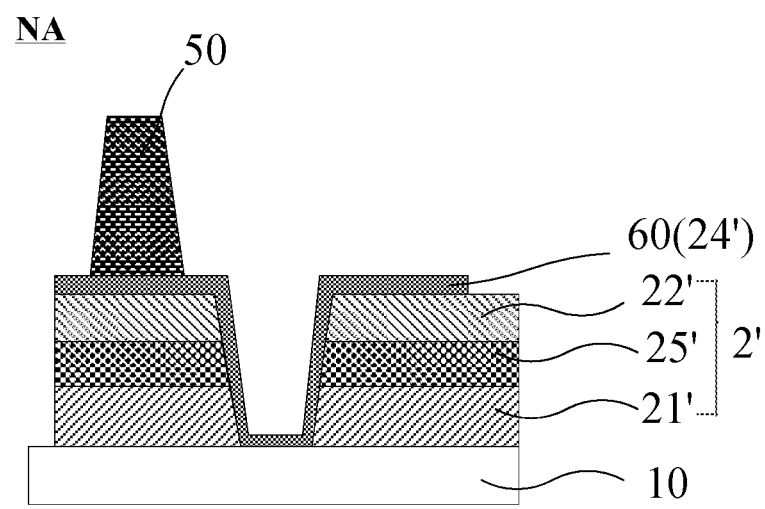
FIG. 7 is a structural representation of the non-display region of yet another organic light-emitting display panel according to an embodiment of the disclosure.
Figure 8:
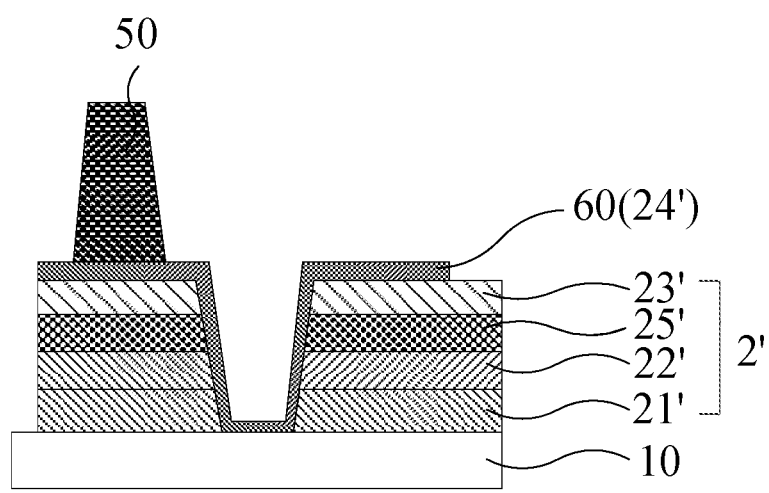
FIG. 8 is a structural representation of the non-display region of yet another organic light-emitting display panel according to an embodiment of the disclosure.
Figure 9:
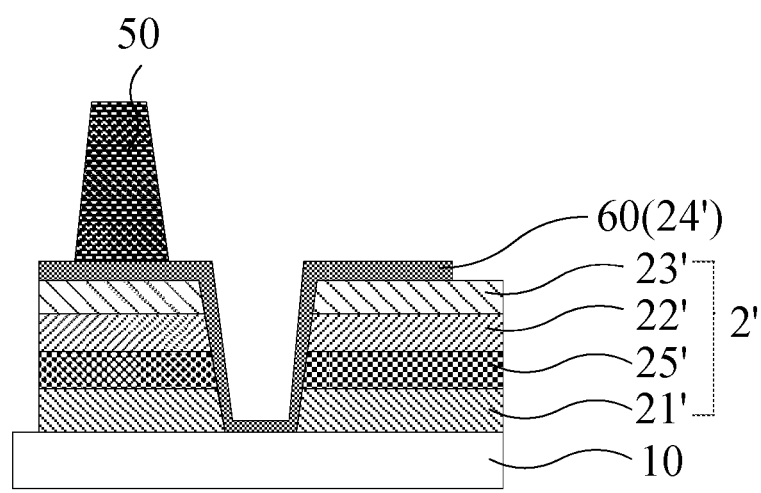
FIG. 9 is a structural representation of the non-display region of yet another organic light-emitting display panel according to an embodiment of the disclosure.

When the structure of the array layer 20 is a bottom gate structure, referring to FIG. 7, it is a structural representation of the non-display region of yet another organic light-emitting display panel according to an embodiment of the disclosure. A part 21' made on the same process as the first insulating layer 21, a part 25' made on the same process as the first metal layer 25 and a part 22' made on the same process as the second insulating layer 22 are successively provided between the substrate 10 and the second part of the metal layer 60. In this structure, a part 25' made on the same process as the first metal layer 25 is provided between the part 21' made on the same process as the first insulating layer 21 and the part 22' made on the same process as the second insulating layer 22, because the first metal layer 25 has a good toughness and a good extensibility, stress concentration caused by directly contacting two inorganic layers may be effectively prevented, so that the bending performance of the non-display region may be improved; moreover, the material of the first metal layer 25 includes a titanium-aluminum-titanium stacked structure, wherein aluminum can react with water and oxygen to generate a compact oxide film, and a part 25' made on the same process as the first metal layer 25 is provided between the part 21' made on the same process as the first insulating layer 21 and the part 22' made on the same process as the second insulating layer 22, so that both a good water-oxygen blocking performance and a good bending performance may be guaranteed. Optionally, referring to FIG. 8 and FIG. 9, FIG. 8 and FIG. 9 are both structural representations of the non-display region of yet another organic light-emitting display panel according to an embodiment of the disclosure. In FIG. 8 and FIG. 9, the non-display region includes a part 21' made on the same process as the first insulating layer 21, a part 22' made on the same process as the second insulating layer 22 and a part 23' made on the same process as the third insulating layer 23, and the metal layer 60 includes a part made on the same process as the second metal layer 24'. Wherein, for the top gate structure, referring to FIG. 8, a part 25' made on the same process as the first metal layer 25 is further included between the part 22' made on the same process as the second insulating layer 22 and the part 23' made on the same process as the third insulating layer 23. For the bottom gate structure, referring to FIG. 9, a part 25' made on the same process as the first metal layer 25 is provided between the part 21' made on the same process as the first insulating layer 21 and the part 22' made on the same process as the second insulating layer 22. By the structure of FIG. 8 and FIG. 9, cracks generated by stress concentration caused by directly contacting two inorganic layers may be effectively eliminated.

Figure 10:
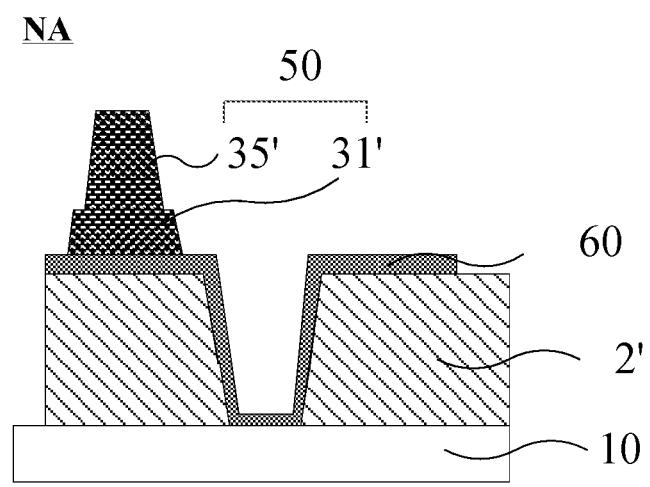
FIG. 10 is a structural representation of the non-display region of yet another organic light-emitting display panel according to an embodiment of the disclosure.

In the embodiment of the disclosure, the bank 50 includes a part made on the same process as at least one of the planarization layer 31 and the pixel defining layer 35. Optionally, referring to FIG. 10, it is a structural representation of the non-display region of yet another organic light-emitting display panel according to an embodiment of the disclosure. In FIG. 10, illustration will be given in an example in which the bank 50 includes a part 31' made on the same process as the planarization layer 31 and a part made on the same process as the pixel defining layer 35'. The materials of the planarization layer 31 and the pixel defining layer 35 include an organic material, for example, any one of allyl resin, epoxy resin, phenolic resin and polyamide resin, an organic material has a good contact performance with a metal, and hence the peeling-off risk during contacting and pressing a mask plate can be reduced, and the side encapsulation effect can be reinforced. The bank 50 includes a part made on the same process as at least one of the planarization layer 31 and the pixel defining layer 35, so that the side encapsulation effect can be reinforced, and also the preparation process can be reduced, thereby improving the process efficiency.

Figure 11:
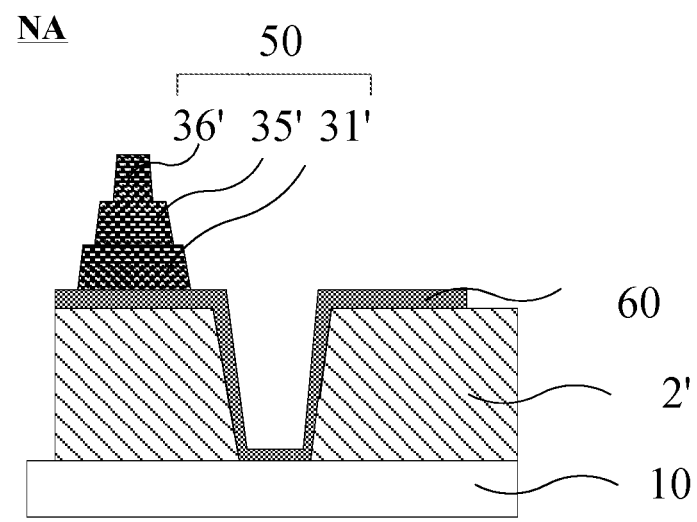
FIG. 11 is a structural representation of the non-display region of yet another organic light-emitting display panel according to an embodiment of the disclosure.

Optionally, in the embodiment of the disclosure, a supporting layer (not shown) is provided on one side of the pixel defining layer 35 that faces away from the substrate 10, and the bank 50 includes a part made in the same manufacturing process as at least one of the planarization layer 31, the pixel defining layer 35 and the supporting layer (not shown). For example, the bank 50 may be consisted of a part 31' made on the same process as the planarization layer 31, or the bank 50 may also be consisted of a part 35' made on the same process as the pixel defining layer 35. Referring to FIG. 11, it is a structural representation of the non-display region of yet another organic light-emitting display panel according to an embodiment of the disclosure. In FIG. 11, the bank 50 successively includes a part 31' made on the same process as the planarization layer 31, a part 35' made on the same process as the pixel defining layer 35 and a part 36' made on the same process as the supporting layer, the material of the supporting layer includes an organic material, for example, any one of allyl resin, epoxy resin, phenolic resin and polyamide resin, and the materials of the planarization layer, the pixel defining layer and the supporting layer may be the same or different, which is not limited in the disclosure.

Figure 12:
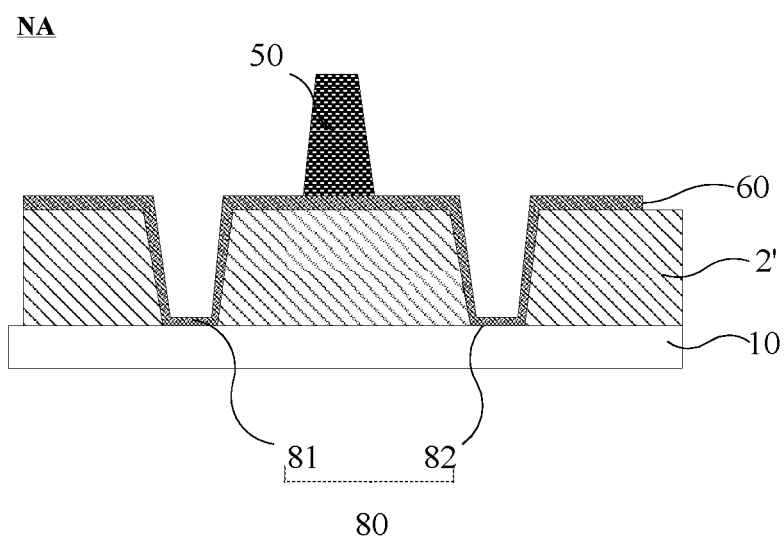
FIG. 12 is a structural representation of the non-display region of yet another organic light-emitting display panel according to an embodiment of the disclosure.

Optionally, in the embodiment of the disclosure, each of both sides of the bank 50 are provided with a groove. For easy illustration, referring to FIG. 12, it is a structural representation of the non-display region of yet another organic light-emitting display panel according to an embodiment of the disclosure. It needs to be noted that, in FIG. 12, illustration will be given in an example in which one bank 50 is provided. In other embodiments, the number of the banks is not limited to one, and there may be two or more banks, which will not be defined in the disclosure and may be set by one skilled in the art as required. In FIG. 12, both sides of the bank 50 are provided with grooves 80, namely, a first groove 81 and second groove 82 respectively. The bank 50 is provided on the second part of the metal layer and contacts the metal layer 60. In the embodiment of the disclosure, a groove is provided on each of both sides of the bank, so that cracks may be effectively prevented from extending. Moreover, when the groove is filled with the metal layer 60, the adhesion performance between the metal layer and the substrate may be reinforced, and the peeling-off risk may be lowered.

Figure 13:
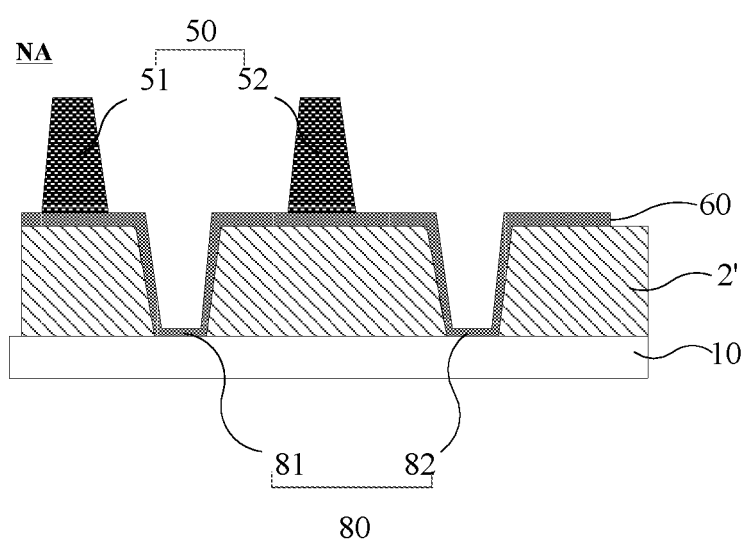
FIG. 13 is a structural representation of the non-display region of yet another organic light-emitting display panel according to an embodiment of the disclosure.

Optionally, referring to FIG. 13, two banks are included, namely, a first bank 51 near to the cutting edge and a second bank 52 near to the display region. The first bank 51 provides a first protection for preventing cutting cracks, and the second bank functions to further reinforcing the prevention of crack extension. Additionally, the second bank 52 may further define the boundary of encapsulation film to prevent the encapsulation film from overflowing, but it may also occupy a wide area of the non-display region, which is adverse to narrow frame.

Figure 14:
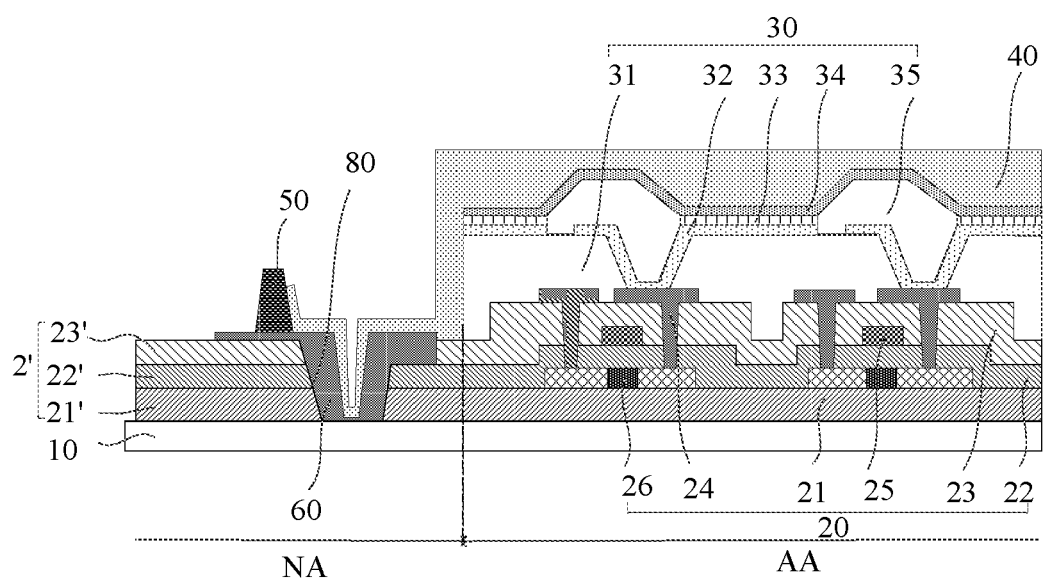
FIG. 14 is a structural representation of another organic light-emitting display panel according to an embodiment of the disclosure.

In the embodiment of the disclosure, optionally, the encapsulation film 40 includes at least one inorganic encapsulation layer and at least one organic encapsulation layer, wherein the at least one inorganic encapsulation layer covers the metal layer 60 in the groove. Referring to FIG. 14, it is a structural representation of another organic light-emitting display panel according to an embodiment of the disclosure. In FIG. 14, the encapsulation film 40 includes at least one inorganic encapsulation layer (not shown) and at least one organic encapsulation layer (not shown), wherein the at least one inorganic encapsulation layer (the encapsulation film 40 in FIG. 14, in fact, it refers to at least one inorganic encapsulation layer in the encapsulation film 40) covers the metal layer in the groove. In the embodiment of the disclosure, the material of the organic encapsulation layer may include a polymer, for example, it may be a monolayer or a stacked layer formed of polyethylene terephthalate, polyimide, polycarbonate, epoxy resin, polyethylene, polyacrylate and organosiloxane. The inorganic encapsulation layer may be a monolayer or a stacked layer containing a metal oxide or a metal nitride. For example, the inorganic encapsulation layer may contain any one of $SiN_x$, $Al_2O_3$, $SiO_2$ and $TiO_2$. The organic encapsulation layer may be made via ink jet printing (IJP), chemical vapor deposition (CVD) and sputtering, plasma-enhanced chemical vapor deposition (PE-CVD), etc., and the inorganic encapsulation layer may be made via ALD, chemical vapor deposition (CVD) and plasma-enhanced chemical vapor deposition (PE-CVD), etc.

Figure 15:
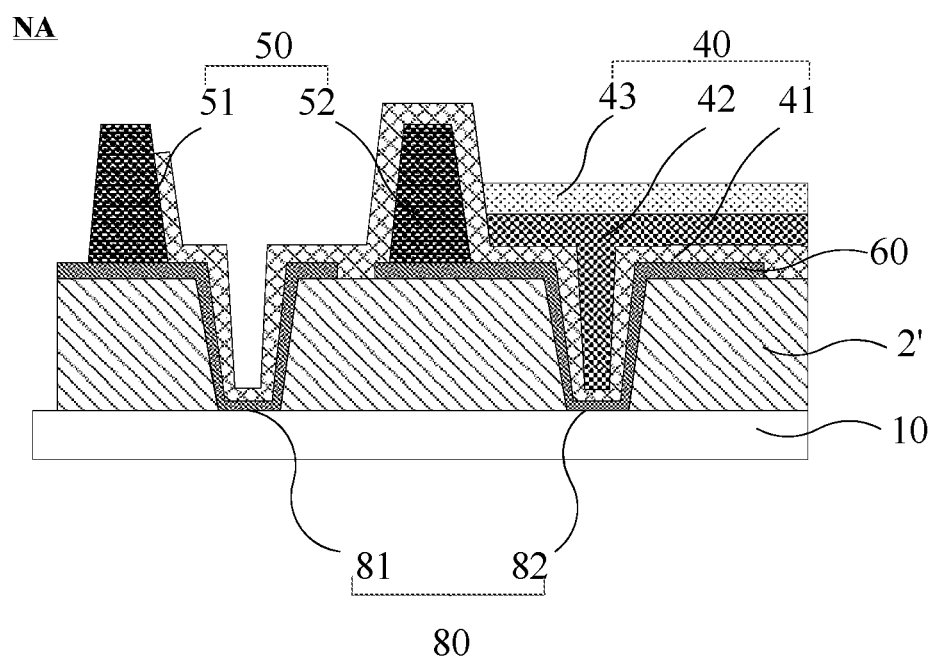
FIG. 15 is a structural representation of the non-display region of yet another organic light-emitting display panel according to an embodiment of the disclosure.

Optionally, referring to FIG. 15, it is a structural representation of the non-display region of yet another organic light-emitting display panel according to an embodiment of the disclosure. In the embodiment of the disclosure, the encapsulation film 40 successively includes a first inorganic encapsulation layer 41, an organic encapsulation layer 42 and a second inorganic encapsulation layer 43, and the bank 50 includes two banks, namely, a first bank 51 away from the display region and a second bank 52 near to the display region, and each of both sides of the second bank 52 are provided with a groove, that is, a first groove 81 and a second groove 82 are provided both sides of the second bank 52, respectively. The first inorganic encapsulation layer 41 covers the first groove 81 and the second groove 82. Optionally, the first inorganic encapsulation layer 41 may also at least partially cover the first bank 51 but not exceed the first bank 51. Such a configuration may effectively improve the water-oxygen blocking effect of the non-display region NA, and further, due to the blocking action of the first bank 51, cracks will not easily extend along the first inorganic layer 41. The edge of the organic encapsulation layer 42 is located between the second bank 52 and the display region, and the organic encapsulation layer 42 covers the second groove 82 between the second bank 52 and the display region. The edge of the second inorganic encapsulation layer 43 is located between the second bank 52 and the display region, and the second inorganic encapsulation layer 43 covers the organic encapsulation layer 42. In the embodiment of the disclosure, the organic encapsulation layer 42 may be made via ink jet printing, and the second bank 52 may function to define the boundary of the organic encapsulation layer 42. The first inorganic encapsulation layer 41 covers the second bank 52 and the groove, and the encapsulation performance of the non-display region may be effectively reinforced by the compact film layer structure of the first inorganic encapsulation layer. In the structure in which the edge of the organic encapsulation layer 42 is located between the second bank 52 and the display region and the organic encapsulation layer 42 covers the groove between the second bank 52 and the display region, and the edge of the second inorganic encapsulation layer 43 is located between the second bank 52 and the display region and the second inorganic encapsulation layer 43 covers the organic encapsulation layer 42, the organic encapsulation layer 42 may effectively alleviate the bending stress between the first inorganic encapsulation layer and the second inorganic encapsulation layer, and bending cracks caused by stress concentration during bending may be prevented.

Figure 16:
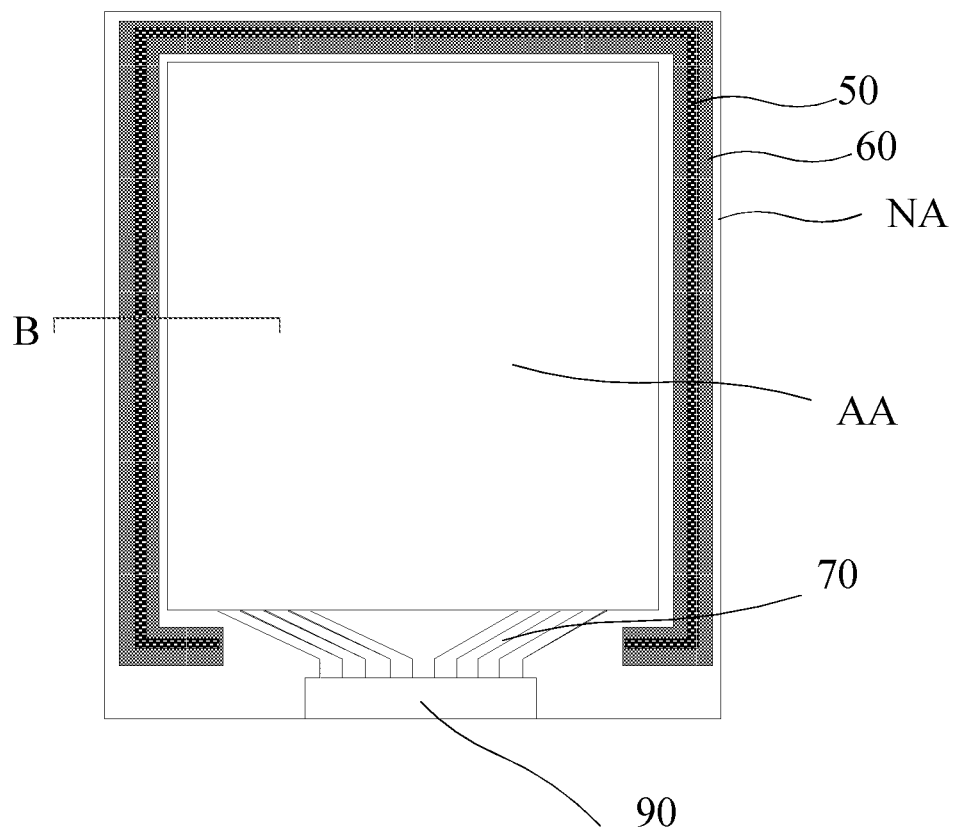
FIG. 16 is a top view showing the structure of an organic light-emitting display panel according to an embodiment of the disclosure.

Optionally, referring to FIG. 16, it is a top view showing the structure of an organic light-emitting display panel according to an embodiment of the disclosure. In the embodiment of the disclosure, the non-display region NA of the substrate 10 includes a fan-shaped wiring region 70, wherein no bank 50 is provided in the fan-shaped wiring region 70. The interference of the metal layer on the signals in the fan-shaped wiring region may be effectively prevented in the case that no metal layer 60 is provided in the fan-shaped wiring region 70. Moreover, the risk of wire climbing and breaking may be lowered in the case that no bank 50 is provided in the fan-shaped wiring region 70. For example, if a bank 50 is provided in the fan-shaped wiring region 70, the touch wires may need to cross the bank 50, which tends to break them so affecting the yield. The wiring in the fan-shaped wiring region 70 is connected with a drive chip 90 to provide a signal to the display region.

Figure 17:
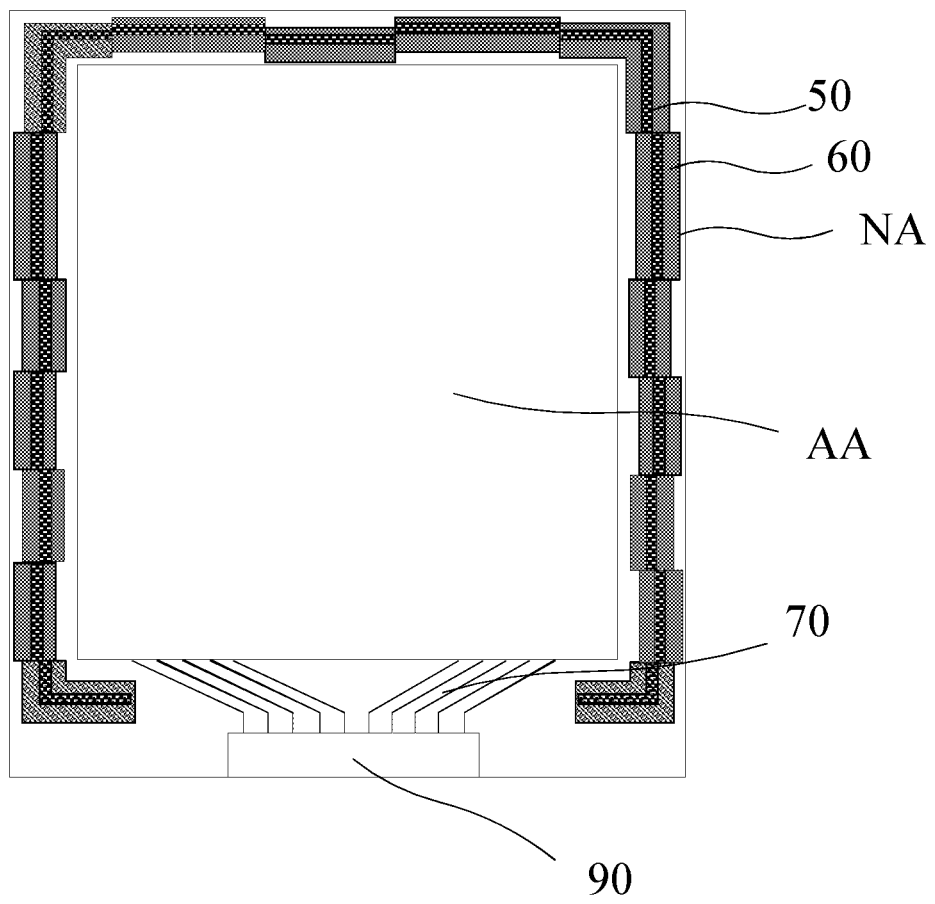
FIG. 17 is a top view showing the structure of another organic light-emitting display panel according to an embodiment of the disclosure.
Figure 18:
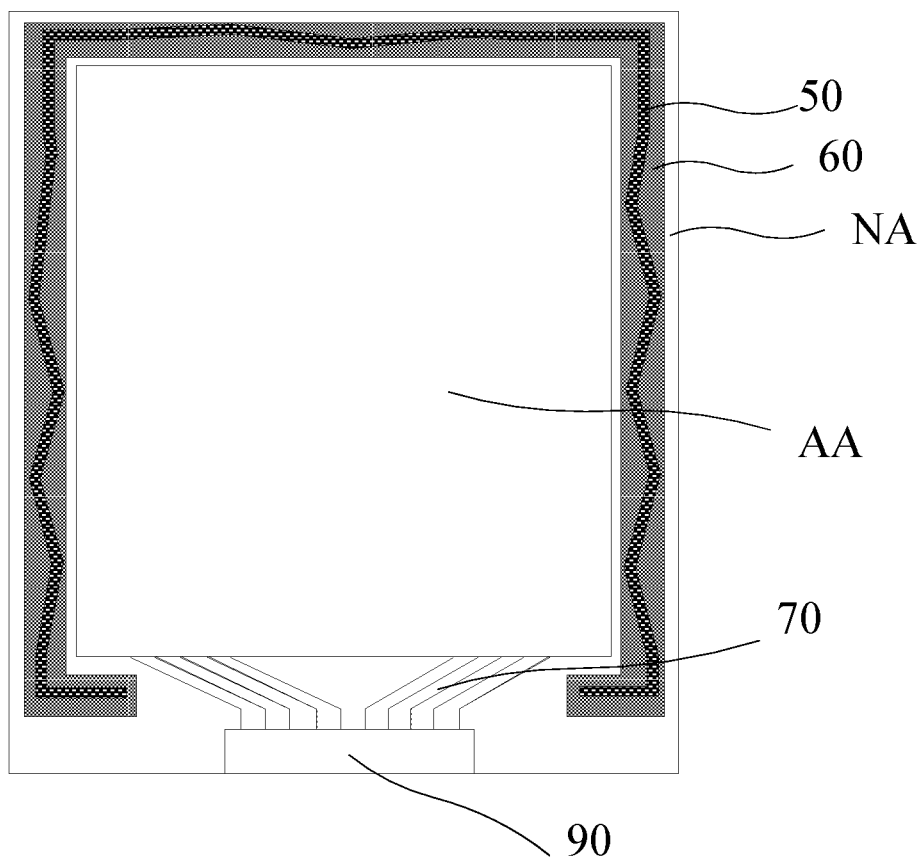
FIG. 18 is a top view showing the structure of another organic light-emitting display panel according to an embodiment of the disclosure.

Optionally, the shape of the bank 50 may be the bar shape in FIG. 16 or the saw tooth shape in FIG. 17 or the polygonal line shape in FIG. 18. In the embodiment of the disclosure, the bending performance of the organic light-emitting display panel may be effectively improved by providing the bank 50 as a saw tooth shape and a polygonal line shape.

It needs to be noted that, FIG. 2, FIG. 3 and FIG. 14 are all cross sectional views of the line B of the display panel in FIG. 16.

It needs to be noted that, in FIG. 16, FIG. 17 and FIG. 18, it shows the case in which one bank 50 is included. In the embodiment of the disclosure, two or more banks may be included, which is not defined in the disclosure. It needs to be further noted that, in the embodiment of the disclosure, a groove may be provided on each of both sides of the bank 50, and the groove is not shown in FIG. 16, FIG. 17 and FIG. 18.

Figure 19:
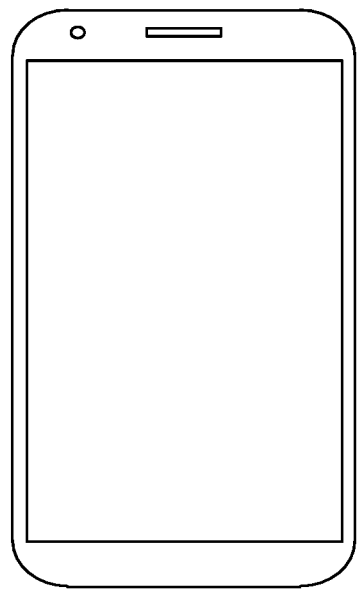
FIG. 19 is a schematic diagram of an organic light-emitting display device according to an embodiment of the disclosure.

Referring to FIG. 19, an embodiment of the disclosure further provides an organic light-emitting display device 200, which includes the organic light-emitting display panel according to any of the above embodiments.

Figure 20:
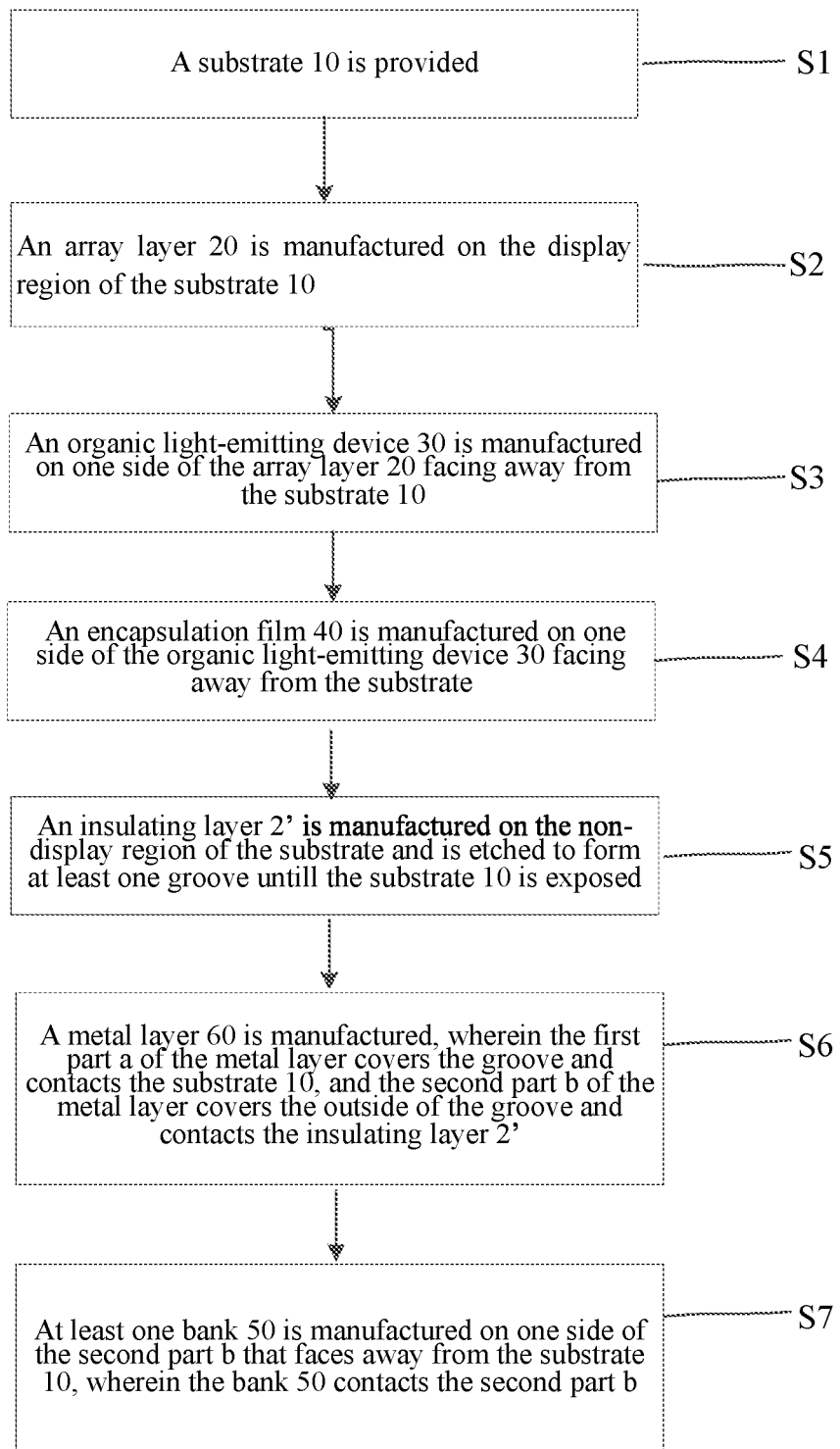
FIG. 20 is a schematic diagram showing the process for manufacturing an organic light-emitting display panel according to an embodiment of the disclosure.
Figure 21A:
FIG. 21a-FIG. 21d are schematic diagrams showing the process for manufacturing an organic light-emitting display panel structure according to an embodiment of the disclosure.
Figure 21B:
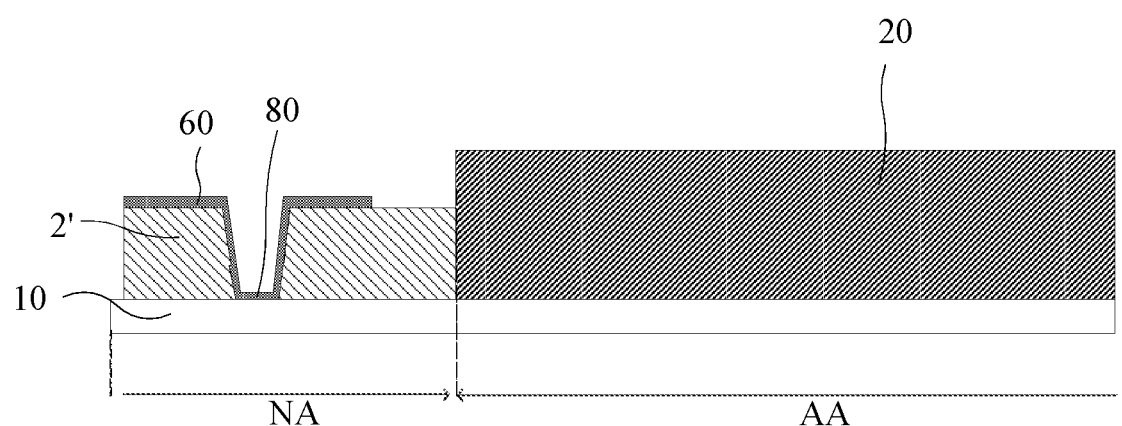
Figure 21C:
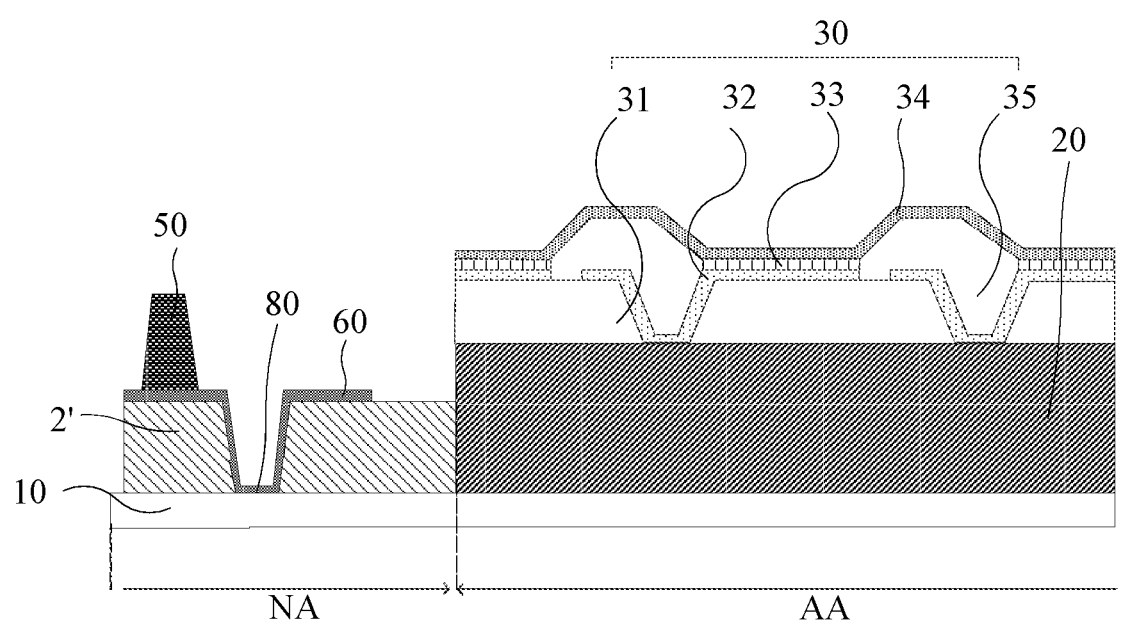

An embodiment of the disclosure further provides a method for manufacturing an organic light-emitting display panel, referring to FIG. 20, the method includes the steps of:

S1: A substrate 10 is provided, which includes a display region AA and a non-display region NA, as shown in FIG. 21a;

S2: An array layer 20 is manufactured on the substrate 10, as shown in FIG. 21b;

S3: An organic light-emitting device 30 is manufactured on one side of the array layer 20 facing away from the substrate 10; wherein, manufacturing the organic light-emitting device 30 includes successively manufacturing a planarization layer 31, a first electrode 32, a pixel defining layer 35, a light-emitting layer 33 and a second electrode 34, as shown in FIG. 21C;

S4: An encapsulation film 40 is manufactured on one side of the organic light-emitting device 30 facing away from the substrate;

The method further includes manufacturing the following structures in the non-display region of the substrate 10 on the same side as the array layer 20:

S5: An insulating layer 2' is manufactured and etched to form at least one groove until the substrate 10 is exposed;

Optionally, referring to FIG. 21b, the insulating layer 2' may also be manufactured when the array layer 20 is manufactured, and the insulating layer 2' is etched to form at least one groove until the substrate 10 is exposed, and the manufacture order of the insulating layer 2' is not limited in the disclosure.

S6: A metal layer 60 is manufactured, which the metal layer 60 includes a first part a and a second part b, wherein the first part a is a part for covering the groove and contacting the substrate 10, and the second part b is a part for covering the outside of the groove and contacting the insulating layer 2'. Optionally, referring to FIG. 21b, the metal layer 60 may be manufactured during the preparation of the array layer 20, and the manufacture order of the metal layer 60 is not limited in the disclosure.

Figure 21D:
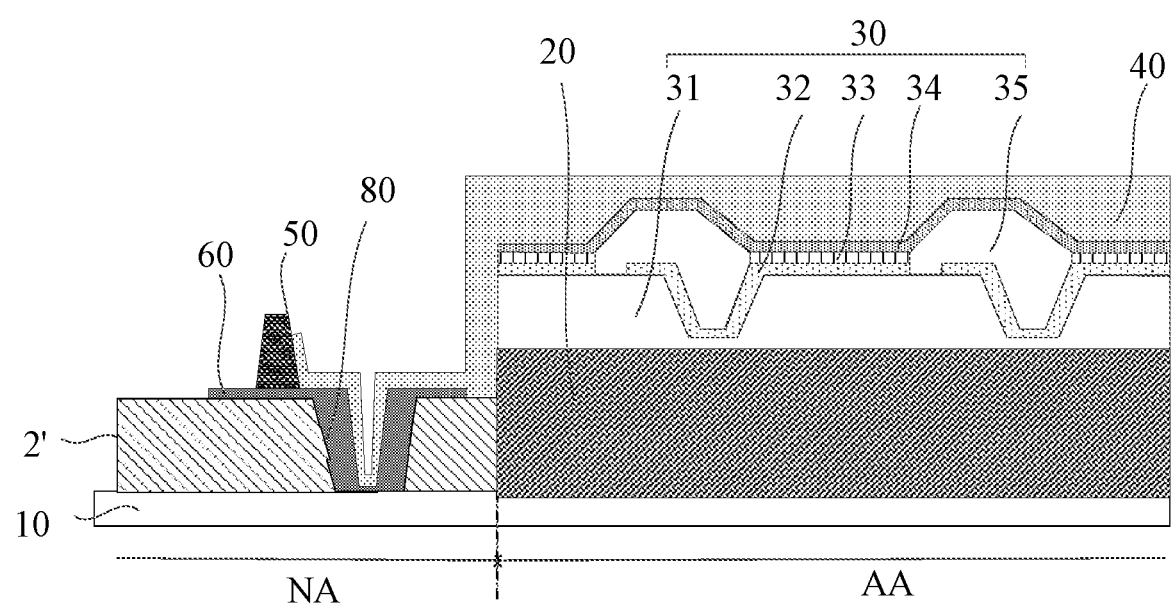

S7: At least one bank 50 is manufactured on one side of the second part b that faces away from the substrate 10, wherein the bank 50 contacts the second part b. Optionally, referring to FIG. 21d, the bank 50 may be manufactured during the preparation of at least one of the planarization layer 31 and the pixel defining layer 35 of the organic light-emitting device 30, and the manufacture order of the bank is not limited in the disclosure. Optionally, in the embodiment of the disclosure, the manufacture of the array layer 20 includes the steps of:

S21: A first insulating layer 21, an active layer 26, a second insulating layer 22, a first metal layer 25, a third insulating layer 23 and a second metal layer 24 are successively manufactured on the substrate 10, wherein, before manufacturing the second metal layer 24, the second insulating layer 22 and the third insulating layer 23 need to be etched to form a via hole, so that the second metal layer 24 may be connected with the active layer by the via hole. The insulating layer 60 is manufactured when at least one of the first insulating layer 21, the second insulating layer 22 and the third insulating layer 23 is manufactured, that is, the insulating layer 60 includes a part made on the same process as at least one of the first insulating layer 21, the second insulating layer 22 and the third insulating layer 23. The metal layer 60 is manufactured when at least one of the first metal layer and the second metal layer is manufactured, that is, the metal layer 60 includes a part made on the same process as at least one of the first metal layer 25 and the second metal layer 24.

Optionally, in the embodiment of the disclosure, the manufacture of the array layer 20 includes the steps of:

S21': A first insulating layer 21, a first metal layer 25, a second insulation layer 22, an active layer 26, a third insulating layer 23 and a second metal layer 24 are successively manufactured on the substrate 10, wherein, before manufacturing the second metal layer 24, the third insulating layer 23 further needs to be etched to form a via hole, and hence the second metal layer 24 is connected with the active layer 26 by the via hole. An insulating layer is manufactured when at least one of the first insulating layer 21, the second insulating layer 22 and the third insulating layer 23 is manufactured, that is, the insulating layer includes a part made on the same process as at least one of the first insulating layer 21, the second insulating layer 22 and the third insulating layer 23. The metal layer 60 is manufactured when at least one of the first metal layer 25 and the second metal layer 24 is manufactured, that is, the metal layer 60 includes a part made on the same process as at least one of the first metal layer 25 and the second metal layer 24.

Optionally, the preparation process of the organic light-emitting device further includes: a supporting layer is manufactured on one side of the pixel defining layer 35 that faces away from the substrate 10, and a bank is manufactured when at least one of the planarization layer, the pixel defining layer and the supporting layer is manufactured, that is, the bank includes a part manufactured in the same manufacturing process as at least one of the planarization layer, the pixel defining layer and the supporting layer.

In the disclosure, the insulating layer in the non-display region of the substrate is provided with at least one groove by which the substrate is exposed, the first part of the metal layer covers the groove and contacts the substrate, a bank is provided on one side of the second part of the metal layer that faces away from the substrate, so that this structure may improve the aqueous vapor blocking effect of the side and prevent cracks of an edge insulating layer from extending to the display region. Because the contact performance of an organic material layer with a metal is superior to the contact performance thereof with an inorganic material layer, the combining capacity between the bank and the substrate can be improved by placing a bank on the metal layer and connecting the bank with the substrate via the metal layer, thereby reducing the peeling-off risk during contacting and pressing a mask plate.

Cracks tend to be formed in an edge inorganic layer during the cutting or bending of a display device, and cracks may be caused in the insulating layer when the mask plate presses the bank. These cracks tend to extend into the display region along an intact insulating layer. In the embodiments, a groove is formed, and a metal layer is provided on the groove. This may prevent the expansion of the cracks, and hence the side encapsulation effect can be improved, and the small amount of aqueous vapor may be prevented to enter from the lateral side and erode the organic light-emitting device.

It should be noted that the embodiments of the present invention and the technical principles used therein are described as above. It should be appreciated that the invention is not limited to the particular embodiments described herein, and any apparent alterations, modification and substitutions can be made without departing from the scope of protection of the invention. Accordingly, while the invention is described in detail through the above embodiments, the invention is not limited to the above embodiments and can further include other additional embodiments without departing from the concept of the invention.

What is claimed is:

1. An organic light-emitting display panel, comprising:
a substrate, comprising a display region and a non-display region,
wherein the display region comprises:
an array layer disposed on the substrate;
an organic light-emitting device, disposed on the array layer, wherein the organic light-emitting device successively comprises a planarization layer, a first electrode, a light-emitting layer, a second electrode, and a pixel defining layer provided between the first electrode and the second electrode to partition the light-emitting layer into light-emitting pixels; and an encapsulation film, disposed on the second electrode layer;

wherein, the non-display region comprises:

an insulating layer, disposed on the substrate, wherein the insulating layer comprises a groove, wherein a bottom of the groove exposes the substrate, and wherein the insulating layer comprises an inorganic material;

a metal layer, wherein at least a part of the metal layer is disposed on one side of the insulating layer facing away from the substrate, wherein the metal layer comprises a first part and a second part, wherein the first part of the metal layer covers side walls and the bottom of the groove and directly contacts the substrate at the bottom of the groove, wherein the second part of the metal layer is disposed on the insulating layer outside the groove, wherein the second part of the metal layer comprises a first portion and a second portion; and at least one bank, disposed directly on the second part of the metal layer facing away from the substrate wherein the at least one bank comprises an organic material;

wherein the bank does not overlap with the first part of the metal layer; and wherein the bank is disposed on the first portion of the second part of the metal layer, and wherein a projection of the bank on the substrate is fully enclosed within a projection of the first portion of the second part of the metal layer on the substrate.

2. The organic light-emitting display panel in claim 1, wherein the array layer on the substrate successively comprises a first insulating layer, an active layer, a second insulating layer, a first metal layer, a third insulating layer and a second metal layer, wherein the second metal layer connects the active layer by a via hole, wherein the insulating layer comprises a portion made on the same process as at least one of the first insulating layer, the second insulating layer and the third insulating layer, and wherein the metal layer comprises a portion made on the same process as at least one of the first metal layer and the second metal layer.

3. The organic light-emitting display panel in claim 1, wherein the array layer on the substrate successively comprises a first insulating layer, a first metal layer, a second insulating layer, an active layer, a third insulating layer and a second metal layer, wherein the second metal layer is connected with the active layer by a via hole, the insulating layer comprises a portion made on the same process as at least one of the first insulating layer, the second insulating layer and the third insulating layer, and wherein the metal layer comprises a portion made on the same process as at least one of the first metal layer and the second metal layer.

4. The organic light-emitting display panel in claim 2, wherein the insulating layer comprises a portion made on the same process as the first insulating layer, and wherein the metal layer comprises a portion made on the same process as at least one of the first metal layer and the second metal layer.

5. The organic light-emitting display panel in claim 2, wherein the insulating layer comprise a portion made on the same process as the first insulating layer and a portion made on the same process as the second insulating layer, and wherein the metal layer comprises a portion made on the same process as at least one of the first metal layer and the second metal layer.

6. The organic light-emitting display panel in claim 3, wherein the insulating layer comprise a portion made on the same process as the first insulating layer and a portion made on the same process as the second insulating layer, and wherein the metal layer comprises a portion made on the same process as the second metal layer.

7. The organic light-emitting display panel in claim 6, wherein the portion made on the same process as the first insulating layer, the portion made on the same process as the first metal layer and the portion made on the same process as the second insulating layer are successively disposed between the substrate and the second part.

8. The organic light-emitting display panel in claim 2 wherein, the insulating layer comprise a portion made on the same process as the first insulating layer, a portion made on the same process as the second insulating layer and a portion made on the same process as the third insulating layer, and wherein the metal layer comprises a portion made on the same process as the second metal layer.

9. The organic light-emitting display panel in claim 8, wherein a portion made on the same process as the first metal layer is further located between the substrate and the second part.

10. The organic light-emitting display panel in claim 1, wherein the bank comprises a portion made on the same process as at least one of the planarization layer and the pixel defining layer.

11. The organic light-emitting display panel in claim 10, wherein a supporting layer is disposed on the pixel defining layer; and wherein the bank comprises a portion made on the process as at least one of the planarization layer, the pixel defining layer and the supporting layer.

12. The organic light-emitting display panel in claim 11, wherein the bank successively from bottom up comprises a portion made on the same process as the planarization layer, a portion made on the same process as the pixel defining layer and a portion made on the same process as the supporting layer.

13. The organic light-emitting display panel in any one of claim 1, wherein a groove is provided at both sides of the bank.

14. The organic light-emitting display panel in claim 13, further comprising two banks.

15. The organic light-emitting display panel in claim 1, wherein the non-display region of the substrate further comprises a fan-shaped wiring region, wherein the bank is not disposed in the fan-shaped wiring region.

16. The organic light-emitting display panel in claim 15, wherein a projection pattern of the bank in a direction perpendicular to the substrate comprises at least one of a bar shape, a saw tooth shape and a polygonal line shape.

17. The organic light-emitting display panel in claim 1, wherein the encapsulation film comprises at least one organic encapsulation layer and at least one inorganic encapsulation layer, wherein the at least one inorganic encapsulation layer covers the metal layer in the groove.

18. The organic light-emitting display panel in claim 17, wherein the encapsulation film successively from bottom up comprises a first inorganic encapsulation layer, an organic encapsulation layer and a second inorganic encapsulation layer;

wherein, the at least one bank comprises two banks, a first bank of the two banks is displaced farther away from the display region than the second bank and wherein the second bank has a groove at each side;

wherein the first inorganic encapsulation layer covers the second bank and the groove, wherein the organic encapsulation layer is located between the second bank and the display region and covers the groove between the second bank and the display region, and wherein the second inorganic encapsulation layer is located between the second bank and the display region and covers the organic encapsulation layer.

19. The organic light-emitting display panel in claim 1, wherein
the metal layer comprises a portion made on the same process as the first electrode.

20. An organic light-emitting display device, comprising:
an organic light-emitting display panel comprising:
a substrate, comprising a display region and a non-display region,
wherein the display region comprises:
an array layer disposed on the substrate;
an organic light-emitting device, disposed on the array layer, wherein the organic light-emitting device successively comprises a planarization layer, a first electrode, a light-emitting layer, a second electrode, and a pixel defining layer provided between the first electrode and the second electrode to partition the light-emitting layer into light-emitting pixels; and
an encapsulation film, disposed on the second electrode layer;
wherein, the non-display region comprises:
an insulating layer, disposed on the substrate, wherein the insulating layer comprises a groove, a bottom of the groove exposes the substrate, and wherein the insulating layer comprises an inorganic material;
a metal layer, wherein at least part of the metal layer is disposed on one side of the insulating layer facing away from the substrate, wherein the metal layer comprises a first part and a second part, wherein the first part of the metal layer covers side walls and the bottom of the groove and directly contacts the substrate at the bottom of the groove, wherein the second part of the metal layer is disposed on the insulating layer outside the groove, wherein the second part of the metal layer comprises a first portion and a second portion; and
at least one bank, disposed directly on the second part of the metal layer facing away from the substrate, wherein the at least one bank comprises an organic material;
wherein the bank does not overlap with the first part of the metal layer and is disposed on the first portion of the second part of the metal layer, and wherein a projection of the bank on the substrate is fully enclosed within a vertical projection of the first portion of the second part of the metal layer on the substrate.

* * * * *